US007009441B2

(12) United States Patent
Fiedler

(10) Patent No.: US 7,009,441 B2
(45) Date of Patent: Mar. 7, 2006

(54) PHASE MULTIPLIER CIRCUIT

(76) Inventor: Alan Fiedler, 8777 Walton Oaks Dr., Bloomington, MN (US) 55438

( * ) Notice: Subject to any disclaimer, the term of this patent is extended or adjusted under 35 U.S.C. 154(b) by 96 days.

(21) Appl. No.: 10/775,310

(22) Filed: Feb. 10, 2004

(65) Prior Publication Data

US 2005/0174160 A1 Aug. 11, 2005

(51) Int. Cl.
*H03K 3/00* (2006.01)

(52) U.S. Cl. ....................................... 327/295; 327/258

(58) Field of Classification Search ................ 327/153, 327/161–163, 291, 295–296, 239, 245, 251, 327/253, 257–259, 355

See application file for complete search history.

(56) References Cited

U.S. PATENT DOCUMENTS 6,441,659 B1 * 8/2002 Demone ..................... 327/156
6,650,157 B1 * 11/2003 Amick et al. ............... 327/158
6,703,879 B1 * 3/2004 Okuda et al. ............... 327/158

* cited by examiner

*Primary Examiner*—My-Trang Nu Ton
(74) *Attorney, Agent, or Firm*—Fulbright & Jaworski L.L.P.

(57) ABSTRACT

So as to generate multiple output signals whose phases are evenly spaced about 360 degrees, and having a frequency equal to that of an input signal, a phase multiplier circuit includes three or more instances of a phase multiplier subcircuit and additional circuitry configured in a negative feedback loop. Each phase multiplier subcircuit includes a difference circuit, a loop filter transistor, and a voltage-controlled delay circuit. The difference circuit converts to a phase current a delay from an input signal to the delay circuit to an output signal from the delay circuit, and subtracts from the phase current a bias current proportional to the smallest positive delay from the output signal with the largest phase to the output signal with the smallest phase. The subtracted current is integrated by the loop filter transistor, and steady-state operation is achieved when for each phase multiplier subcircuit, the bias current is equal to the phase current. Evenly spaced phases of the output signals about 360 degrees are achieved when the delay to phase current gain and delay to bias current gain are substantially equal.

14 Claims, 7 Drawing Sheets

Fig. 4
time
time
31
30
RESET
BIASPn (n=1,2,3)

PHASE MULTIPLIER CIRCUIT

RELATED APPLICATION

This application claims the benefit of priority pursuant to 35 USC § 119(e) from U.S. provisional patent application Ser. No. 60/445,657, filed Feb. 7, 2003, and entirely incorporated herein by reference.

BACKGROUND OF THE INVENTION

The function of a phase multiplier circuit is to generate equal-frequency output signals, each having a phase, from an input signal. In one embodiment, the phases of the output signals are evenly spaced between 0 and 360 degrees.

FIG. 1 is a schematic diagram illustrating an example of a phase multiplier of the prior art. This circuit is commonly referred to as a delay-locked loop. A voltage-controlled delay line 2 is coupled to an input signal IN and is comprised of five voltage-controlled delay subcircuits U1, U2, U3, U4, and U5, and has four outputs: OUT1, OUT2, OUT3, and OUT4.

Also included in FIG. 1 is a phase detector 3, a charge pump 4, a loop filter capacitor C1, a reset transistor M3, a reset inverter U12, and a reset synchronization flip-flop U10. The phase detector includes flip-flops U6 and U7, AND gate U8, and OR gate U9. The charge pump includes transistors M1 and M2, and inverter U11. The voltage of a CONTROL node controls the delay though the delay subcircuits. Coupled to the CONTROL node is the charge pump, the loop filter capacitor, and the voltage controlled delay line.

Initially, the delay-locked loop is reset by asserting RESET high. In this state, the voltage of the CONTROL node is set to AVDD, forcing the delay through the delay line to a minimum, and the phase detector is also reset. Through action of U10, phase detector reset signal RESETX is synchronous to the rising edge of IN. Subsequent to the falling edge of RESET, RESETX must fall immediately after the rising edge of IN but before the rising edge of FB. D flip-flop U10 ensures that this occurs by synchronizing RESETX to the rising edge of IN.

After RESET is deasserted low, and by adjusting the voltage of the CONTROL node in a negative feedback loop, the delay-locked loop increases the delay of the delay line until the phase of FB is equal to the phase of OUT1. It then follows that the phases of the output signals are equally spaced about 360 degrees, but only if the delay subcircuits are well matched, and the phase error between FB and OUT1 is zero. These two requirements to achieve equal spacing can be difficult to meet. By eliminating the phase detector and by measuring and adjusting the delays of delay subcircuits individually, the present invention effectively eliminates these requirements for equal phase spacing.

SUMMARY OF THE INVENTION

So as to generate multiple output signals whose phases are evenly spaced about 360 degrees, and having a frequency equal to that of an input signal, a phase multiplier circuit includes three or more instances of a phase multiplier subcircuit and additional circuitry configured in a negative feedback loop.

The particular utility and value in this phase multiplier circuit is the use of circuitry to measure, and feedback to control, the phases of the output signals such that they are accurately and evenly spaced between 0 and 360 degrees. Small (and, therefore, low-power but poorly-matched) transistors are used to generate a delay from each output signal to the next, and relatively large (and, therefore, well-matched) transistors operating at low power are used to measure the relative phases of the generated signals. This approach simultaneously achieves the desirable goals of both accurate phase control and low power.

DETAILED DESCRIPTION OF THE PREFERRED EMBODIMENTS

Figure 1:
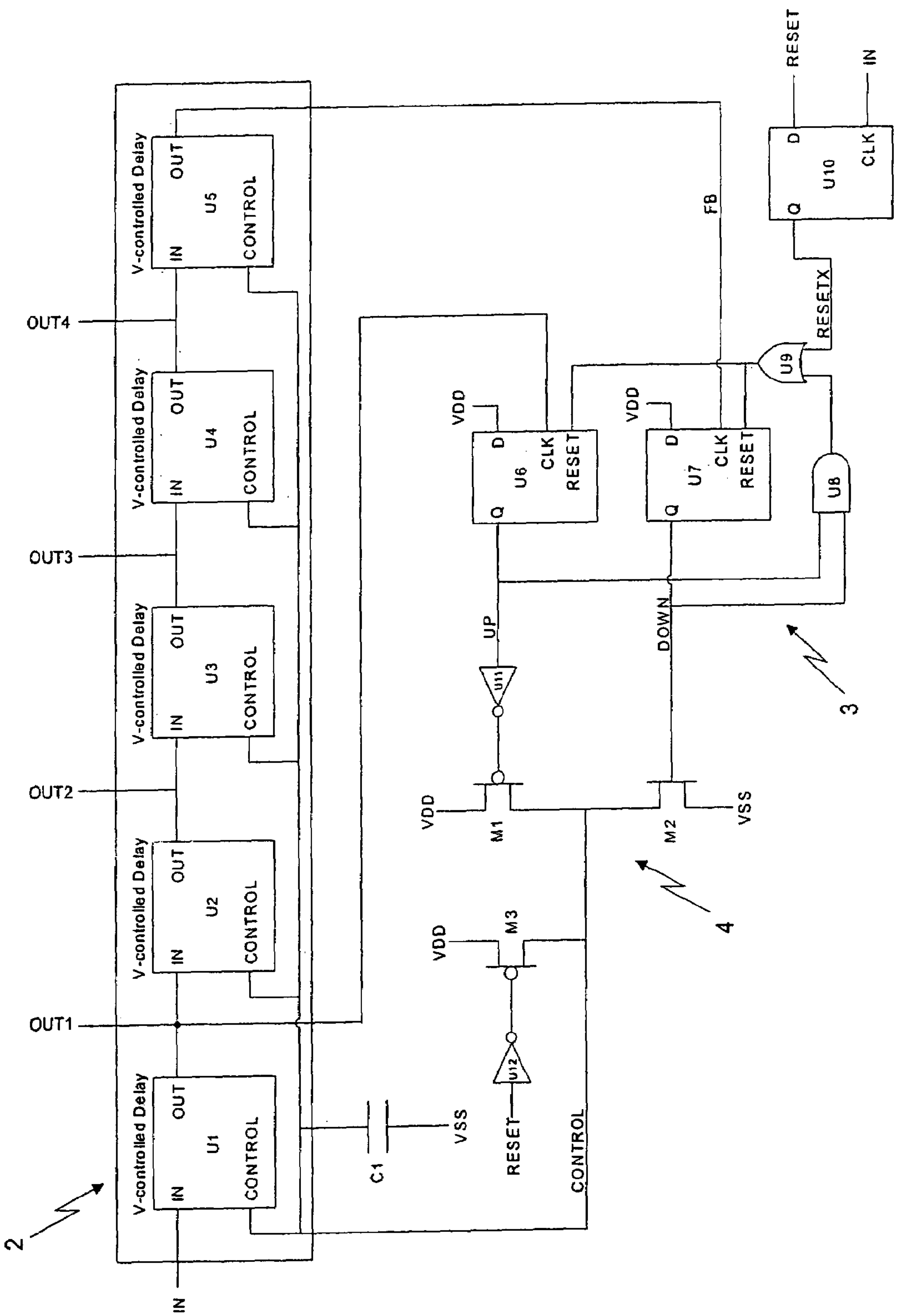
FIG. 1 is a schematic diagram of a phase multiplier circuit of the prior art.
Figure 2:
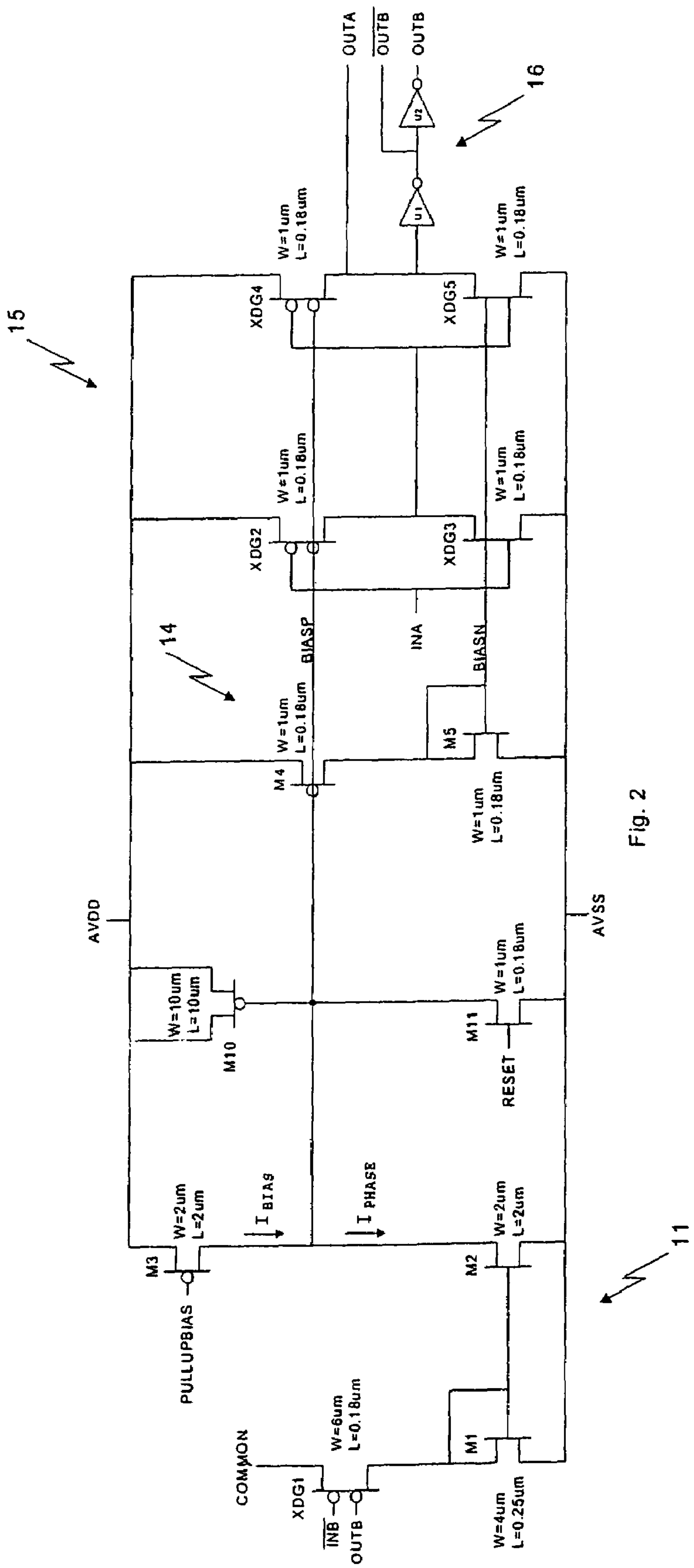
FIG. 2 is a schematic diagram of the phase multiplier subcircuit, in accordance with the present invention.
Figure 3:
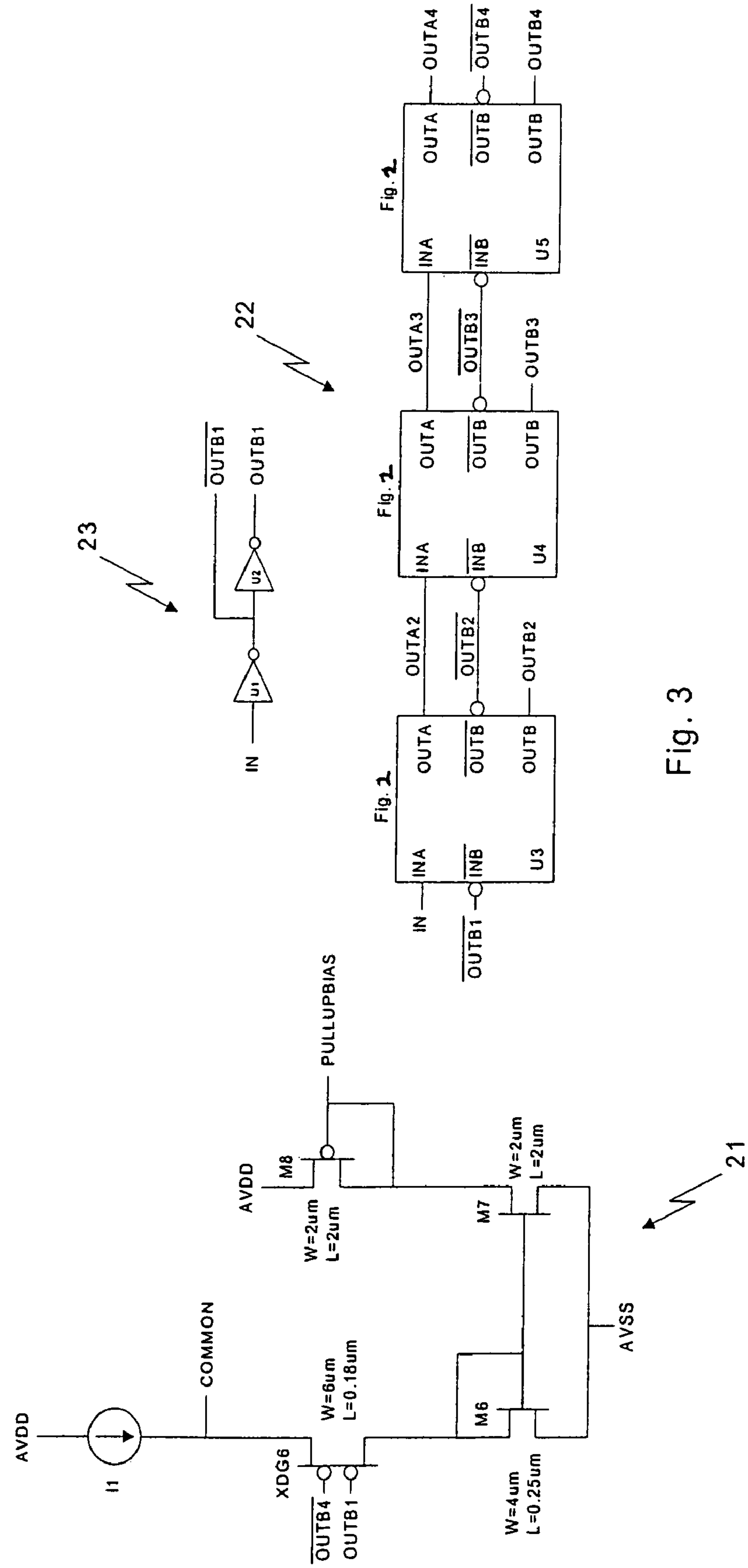
FIG. 3 is a schematic diagram of the phase multiplier circuit, in accordance with the present invention.

Three instances of the phase multiplier subcircuit of FIG. 2 and additional circuitry comprise the phase multiplier circuit of FIG. 3. The phase multiplier subcircuit of FIG. 2 comprises a difference circuit 11, a loop filter transistor M10, a reset transistor M11, a BIASN generation circuit 14, a voltage controlled delayed circuit 15, and a buffer 16.

The difference circuit 11 converts a phase delay to a phase current and subtracts this phase current from a bias current. Difference circuit 11 comprises p-channel dual-gate transistor XDG1 having a source coupled to common node COMMON, and first and second gate inputs coupled to inputs /INB and OUTB; a first current mirror comprising n-channel transistors M1 and M2, and bias current source transistor M3. Transistor XDG1 sources a first current during a period of time when inputs /INB and OUTB are both low, and this period of time is a measure of a phase delay from a falling edge of /INB to a rising edge of OUTB. The first current is mirrored by the current mirror which has an output which sinks the phase current. The phase current and the bias current are respectively conducted through the output of the current mirror and the drain of transistor M3, and this output and drain are coupled to the BIASP integration node. Also coupled to BIASP is the loop filter transistor M10; reset transistor M11; and current mirror 14, comprising p-channel transistor M4 having a drain coupled to bias node BIASN and a gate coupled to BIASP, and n-channel transistor M5 having a gate and drain coupled to BIASN. The gate of transistor M3 is coupled to input PULLUPBIAS.

Coupled to the BIASP integration node and the BIASN bias node is the voltage controlled delay circuit 15, comprising dual-gate n-channel transistors XDG3 and XDG5, and dual-gate p-channel transistors XDG2 and XDG4. First gate inputs of XDG2 and XDG3 are coupled to input signal INA, second gate inputs of XDG2 and XDG4 are coupled to BIASP, and second gate inputs of XDG3 and XDG5 are coupled to BIASN. Drains of XDG2 and XDG3 are coupled together and to first gate inputs of XDG4 and XDG5. Drains of XDG4 and XDG5 are coupled together and to output OUTA and to the input of inverter U1. The output of U1 is coupled to output /OUTB and to the input of inverter U2. The output of U2 is coupled to output OUTB.

FIG. 3 illustrates the phase multiplier circuit, comprising an interconnection of multiple instances of the phase multiplier subcircuit and additional circuitry. The phase multiplier circuit further comprises a current source I1, a circuit 21 for converting a second measure of phase delay to a bias voltage $V_{PULLUPBIAS}$, three interconnected phase multiplier subcircuits 22, and a buffer 23.

Current source I1 is coupled between power supply AVDD and common node COMMON.

Circuit 21 of the phase multiplier circuit converts a phase delay to the bias voltage $V_{PULLUPBIAS}$ and comprises p-channel dual-gate transistor XDG6 having a source coupled to common node COMMON, and first and second gate inputs coupled to inputs /OUTB4 and OUTB1; a second current mirror comprising n-channel transistors M6 and M7; and diode-connected p-channel transistor M8. Transistor XDG6 sources a second current during a period of time when inputs /OUTB4 and OUTB1 are both low. This period is the second measure of phase delay, and is equal to the time from a falling edge of /OUTB4 to a rising edge of OUTB1. The second current is mirrored by the second current mirror which has an output coupled to PULLUPBIAS and to the gate and drain of transistor M8. Transistor M3 of each phase multiplier subcircuit of FIG. 2 and transistor M8 form current mirrors having a gain substantially equal to one.

The first current mirror of difference circuit 11 and the second current mirror of circuit 21 are matched to each other, and in a preferred embodiment, the current gain of each of these current mirrors is substantially less than one.

The three interconnected phase multiplier subcircuits 22 comprise first, second, and third phase multiplier subcircuits U3, U4, and U5. The first phase multiplier subcircuit has first and second inputs INA and /INB coupled to IN and /OUTB1, and first, second, and third outputs OUTA, /OUTB, and OUTB coupled to OUTA2, /OUTB2, and OUTB2. The second phase multiplier subcircuit has first and second inputs INA and /INB coupled to OUTA2 and /OUTB2, and first, second, and third outputs OUTA, /OUTB, and OUTB coupled to OUTA3, /OUTB3, and OUTB3. The third phase multiplier subcircuit has first and second inputs INA and /INB coupled to OUTA3 and /OUTB3, and first, second, and third outputs OUTA, /OUTB, and OUTB coupled to OUTA4, /OUTB4, and OUTB4.

Buffer 23 comprises first and second inverters. The first inverter U1 has an input coupled to IN and an output coupled to /OUTB1, and the second inverter U2 has an input coupled to /OUTB1 and an output coupled to OUTB1.

In a preferred embodiment, outputs OUTBn (n=1, 2, 3, 4) comprise the output signals. Using circuit 21 and each transistor M3 of the phase multiplier subcircuits, a bias current is generated within each of the phase multiplier subcircuits which is substantially in proportion to the second measure of a phase delay. Also within each phase multiplier subcircuit the difference circuit subtracts the bias current from the phase current. A stable, steady-state operating point of the phase multiplier circuit occurs when for each phase multiplier subcircuit, the bias current is equal to the phase current. By extension, the second measure of phase delay and each measure of the phase delay of the phase multiplier subcircuits will also be equal. Further, this ensures that the phase of each of the output signals OUTBn (n=1, 2, 3, 4) will be substantially equally spaced about 360 degrees, as desired.

Figure 4:
FIG. 4 illustrates phase multiplier circuit waveforms.

FIG. 4 illustrates sample waveforms of input RESET and outputs BIASPn (n=1, 2, 3) of the phase multiplier subcircuits. The voltages of outputs BIASPn (n=1, 2, 3) transition from an initial state to a final state following the de-assertion of RESET from a logic high level to a logic low level.

Figure 5:
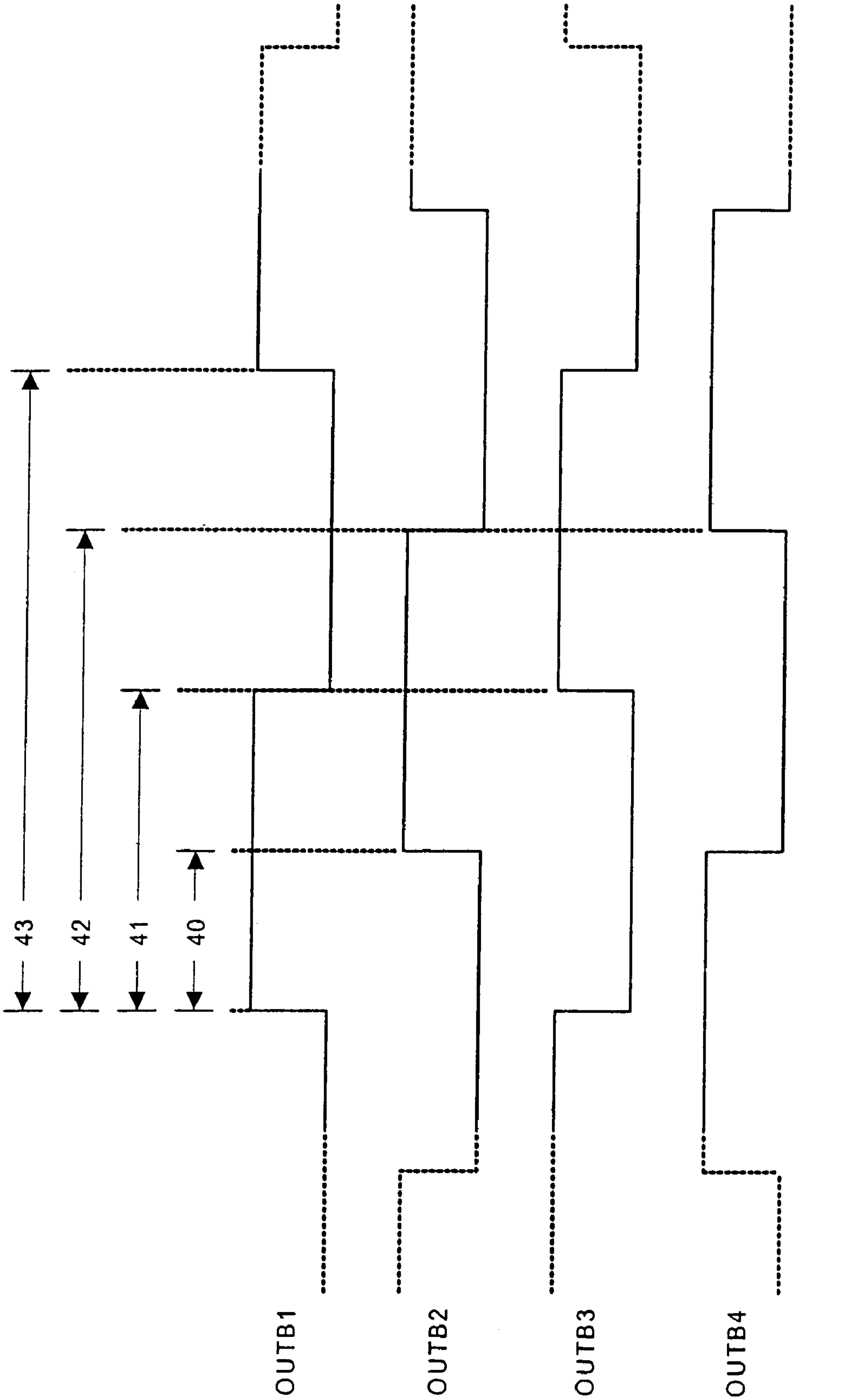
FIG. 5 illustrates the output signals of the phase multiplier circuit.

FIG. 5 illustrates sample waveforms of the output signals OUTBn (n=1, 2, 3, 4) after the BIASP nodes of the phase multiplier subcircuits have transitioned to their final values. In steady state, each phase current is equal to a bias current, and the phases of OUTBn (n=1, 2, 3, 4) 40, 41, 42, and 43 are substantially equal to 90, 180, 270, and 360 degrees. This is the desired result.

Figure 6:
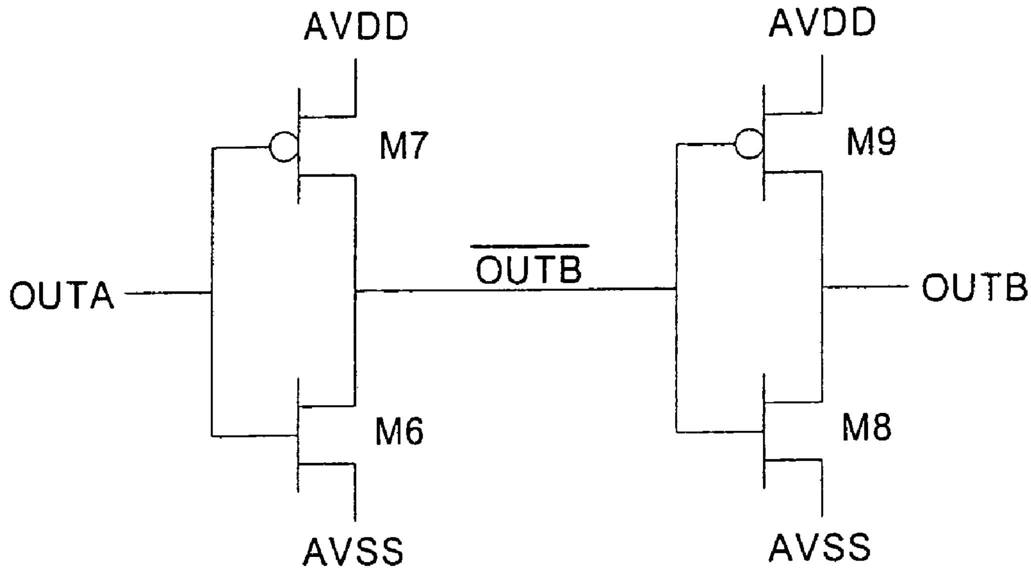
FIG. 6 is a schematic of a buffer.
Figure 7:
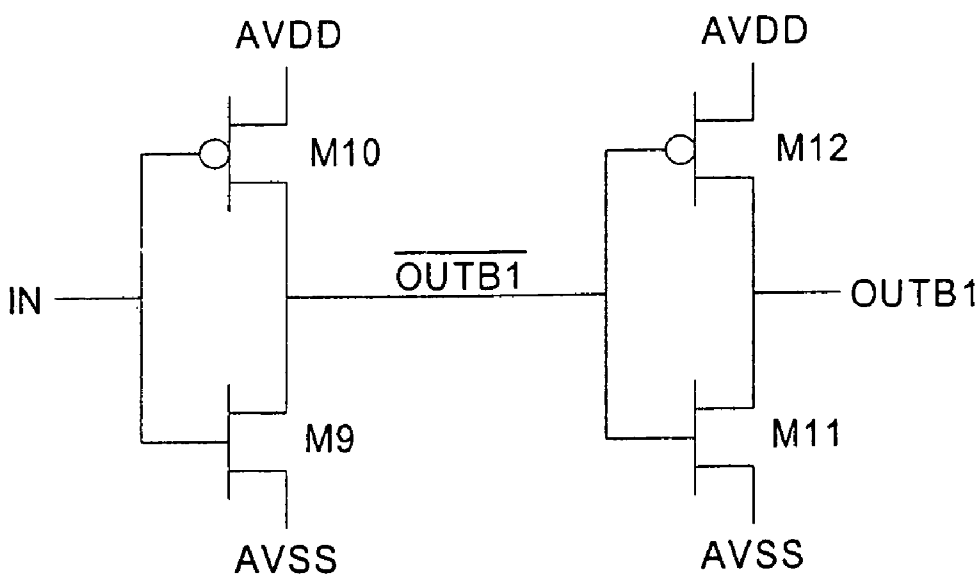
FIG. 7 is a schematic of a buffer.

FIG. 6 illustrates logic inverters U1 and U2 of buffer 15 of the phase multiplier subcircuit of FIG. 2, and FIG. 7 illustrates logic inverters U3 and U4 of buffer 23 of the phase multiplier circuit of FIG. 3.

Figure 8A:
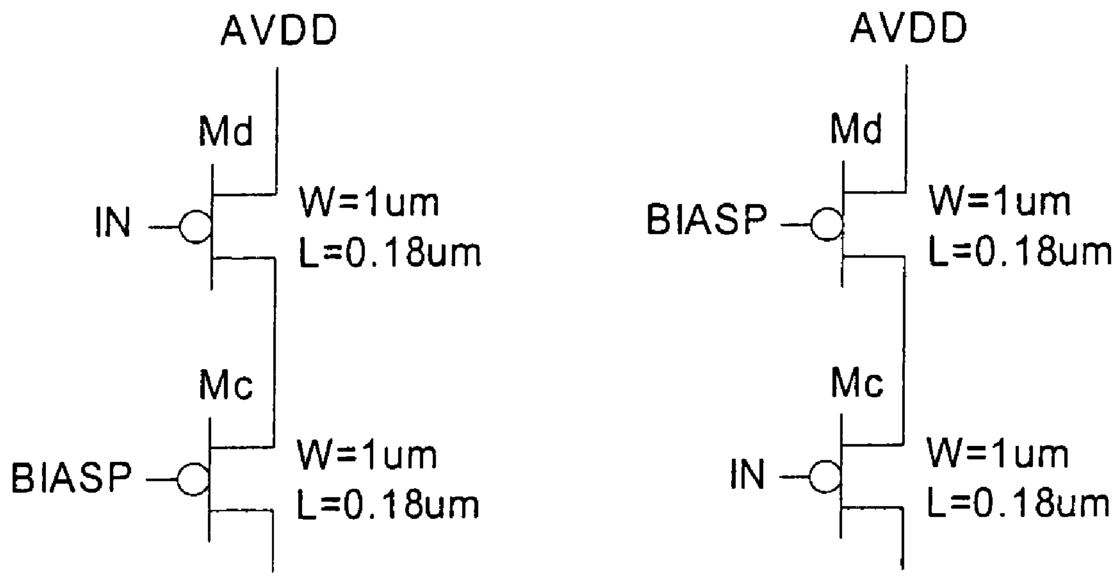
FIGS. 8*a*–8*b* are a schematic of dual-gate transistors and particular implementations thereof.
Figure 8B:
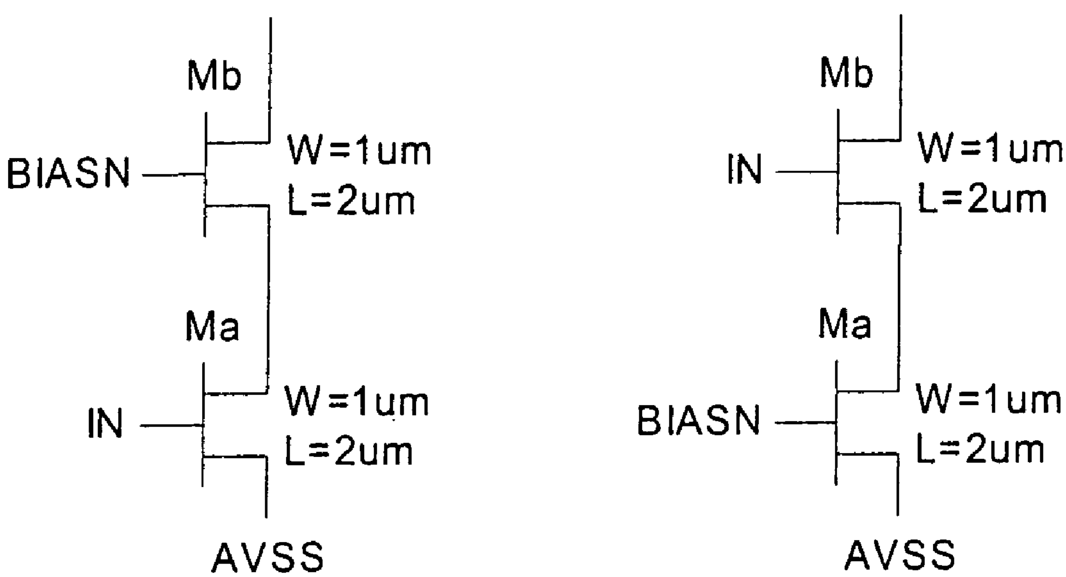

FIG. 8*a* illustrates two possible circuit choices for dual-gate transistor XDG2 of FIG. 2, and FIG. 8*b* illustrates two possible circuit choices for dual-gate transistor XDG3 of FIG. 2. Similar circuit choices exists for dual-gate transistors XDG1, XDG4, and XDG5 of FIG. 2, and XDG6 of FIG. 3.

In FIGS. 2, 3, 6, and 7, the following nodes are coupled together with other nodes of the same name: COMMON, PULLUPBIAS, AVSS, and AVDD.

The following claims describe the generation of four output signals using three interconnected phase multiplier subcircuits and additional circuitry. Those skilled in the art will recognize that through the use more than three phase multiplier subcircuits, more than four output signals can be generated. Except to the extent specified in the following claims, the circuit configurations and device sizes shown herein are provided as examples only. Those skilled in the art will recognize that desired and proper circuit operation can be achieved with many other circuit configurations, device sizes, and/or combinations of device sizes.

The phase multiplier circuit can be implemented with discreet components, with semiconductor devices embedded in an integrated circuit such as an application specific integrated circuit (ASIC), or with a combination of both. Individual signals or devices can be active high or low, and corresponding circuitry can be converted or complemented to suit any particular convention. The term "coupled" used in the claims includes various types of connections or couplings and includes a direct connection or a connection through one or more intermediate components.

What is claimed is:

1. A phase multiplier subcircuit, comprising:

first and second subcircuit power supply terminals;

a PULLUPBIAS subcircuit terminal;

a COMMON subcircuit terminal;

INA and /INB subcircuit terminals;

OUTA, /OUTB, and OUTB subcircuit terminals;

a first dual-gate transistor having a single drain, a first gate coupled to the OUTB subcircuit terminal, a second gate coupled to the /INB subcircuit terminal, and a single source coupled to the COMMON subcircuit terminal;

a first transistor having a gate and a drain coupled to the single drain of the first dual-gate transistor, and a source coupled to the first subcircuit power supply terminal;

a second transistor having a drain coupled to a BIASP integration node, a gate coupled to the gate of the first transistor, and a source coupled to the first subcircuit power supply terminal;

a third transistor having a drain coupled to the BIASP node, a gate coupled to the PULLUPBIAS subcircuit terminal, and a source coupled to the second subcircuit power supply terminal;

a fourth transistor having a drain coupled to a BIASN node, a gate coupled to the BIASP node, and a source coupled to the second subcircuit power supply terminal;

a fifth transistor having a gate and a drain coupled to the BIASN node, and a source coupled to the first subcircuit power supply terminal;

a second dual-gate transistor having a single drain, a first gate coupled to the BIASP node, a second gate coupled to the INA subcircuit terminal, and a single source coupled to the second subcircuit power supply terminal;

a third dual-gate transistor having a single drain coupled to the single drain of the second dual-gate transistor, a first gate coupled to the BIASN node, a second gate coupled to the INA subcircuit terminal, and a single source coupled to the first subcircuit power supply terminal;

a fourth dual-gate transistor having a single drain coupled to the OUTA subcircuit terminal, a first gate coupled to the BIASP node, a second gate coupled to the single drain of the third dual-gate transistor, and a single source coupled to the second subcircuit power supply terminal;

a fifth dual-gate transistor having a single drain coupled to the OUTA subcircuit terminal, a first gate coupled to the BIASN node, a second gate coupled to the drain of the third dual-gate transistor, and a single source coupled to the first subcircuit power supply terminal;

a first inverter having an output terminal coupled to the /OUTB subcircuit terminal, and an input terminal coupled to the OUTA subcircuit terminal; and a second inverter having an output terminal coupled to the OUTB subcircuit terminal, and an input terminal coupled to the /OUTB subcircuit terminal.

2. The phase multiplier subcircuit of claim 1, wherein:

the first inverter comprises:

a sixth transistor having a drain coupled to the /OUTB subcircuit terminal, a gate coupled to the OUTA subcircuit terminal, and a source coupled to the first subcircuit power supply terminal; and a seventh transistor having a drain coupled to the /OUTB subcircuit terminal, a gate coupled to the OUTA subcircuit terminal, and a source coupled to the second subcircuit power supply terminal; and the second inverter comprises:

an eighth transistor having a drain coupled to the OUTB subcircuit terminal, a gate coupled to the /OUTB subcircuit terminal, and a source coupled to the first subcircuit power supply terminal; and a ninth transistor having a drain coupled to the OUTB subcircuit terminal, a gate coupled to the /OUTB subcircuit terminal, and a source coupled to the second subcircuit power supply terminal.

3. A phase multiplier circuit comprising:

first and second power supply terminals;

an input signal terminal;

first, second, third, and fourth output terminals;

a COMMON node;

a PULLUPBIAS node;

a first inverter having an output terminal, and an input terminal coupled to the input signal terminal;

a second inverter having an output terminal coupled to the first output terminal, and an input terminal coupled to the output terminal of the first inverter;

a plurality of phase multiplier subcircuits, each comprising:

first and second subcircuit power supply terminals;

a PULLUPBIAS subcircuit terminal;

a COMMON subcircuit terminal;

INA and /INB subcircuit terminals;

OUTA, /OUTB, and OUTB subcircuit terminals;

a first dual-gate transistor having a single drain, a first gate coupled to the OUTB subcircuit terminal, a second gate coupled to the /INB subcircuit terminal, and a single source coupled to the COMMON subcircuit terminal;

a first transistor having a gate and a drain coupled to the single drain of the first dual-gate transistor, and a source coupled to the first subcircuit power supply terminal;

a second transistor having a drain coupled to a BIASP integration node, a gate coupled to the gate of the first transistor, and a source coupled to the first subcircuit power supply terminal;

a third transistor having a drain coupled to the BIASP node, a gate coupled to the PULLUPBIAS subcircuit terminal, and a source coupled to the second subcircuit power supply terminal;

a fourth transistor having a drain coupled to a BIASN node, a gate coupled to the BIASP node, and a source coupled to the second subcircuit power supply terminal;

a fifth transistor having a gate and a drain coupled to the BIASN node, and a source coupled to the first subcircuit power supply terminal;

a second dual-gate transistor having a single drain, a first gate coupled to the BIASP node, a second gate coupled to the INA subcircuit terminal, and a single source coupled to the second subcircuit power supply terminal;

a third dual-gate transistor having a single drain coupled to the single drain of the second dual-gate transistor, a first gate coupled to the BIASN node, a second gate coupled to the INA subcircuit terminal, and a single source coupled to the first subcircuit power supply terminal;

a fourth dual-gate transistor having a single drain coupled to the OUTA subcircuit terminal, a first gate coupled to the BIASP node, a second gate coupled to the single drain of the third dual-gate transistor, and a single source coupled to the second subcircuit power supply terminal;

a fifth dual-gate transistor having a single drain coupled to the OUTA subcircuit terminal, a first gate coupled to the BIASN node, a second gate coupled to the drain of the third dual-gate transistor, and a single source coupled to the first subcircuit power supply terminal;

a first inverter having an output terminal coupled to the /OUTB subcircuit terminal, and an input terminal coupled to the OUTA subcircuit terminal; and a second inverter having an output terminal coupled to the OUTB subcircuit terminal, and an input terminal coupled to the /OUTB subcircuit terminal;

a first one of the plurality of phase multiplier subcircuits wherein:

the first subcircuit power supply terminal is coupled to the first power supply terminal;

the second subcircuit power supply terminal is coupled to the second power supply terminal;

the PULLUPBIAS subcircuit terminal is coupled to the PULLUPBIAS node;

the COMMON subcircuit terminal is coupled to the COMMON node;
the INA subcircuit terminal is coupled to the input signal terminal;
the /INB subcircuit terminal is coupled to the first inverter's output terminal; and
the OUTB subcircuit terminal is coupled to the second output terminal;
a second one of the plurality of phase multiplier subcircuits wherein:
the first subcircuit power supply terminal is coupled to the first power supply terminal;
the second subcircuit power supply terminal is coupled to the second power supply terminal;
the PULLUPBIAS subcircuit terminal is coupled to the PULLUPBIAS node;
the COMMON subcircuit terminal is coupled to the COMMON node;
the INA subcircuit terminal is coupled to the first phase multiplier subcircuit's OUTA terminal;
the /INB subcircuit terminal is coupled to the first phase multiplier subcircuit's /OUTB terminal; and
the OUTB subcircuit terminal is coupled to the third output terminal;
a third one of the plurality of phase multiplier subcircuits wherein:
the first subcircuit power supply terminal is coupled to the first power supply terminal;
the second subcircuit power supply terminal is coupled to the second power supply terminal;
the PULLUPBIAS subcircuit terminal is coupled to the PULLUPBIAS node;
the COMMON subcircuit terminal is coupled to the COMMON node;
the INA subcircuit terminal is coupled to the second phase multiplier subcircuit's OUTA terminal;
the /INB subcircuit terminal is coupled to the second phase multiplier subcircuit's /OUTB terminal; and
the OUTB subcircuit terminal is coupled to the fourth output terminal;
a sixth dual-gate transistor having a single drain coupled to a second node, a first gate coupled to the first output terminal, a second gate coupled to the third phase multiplier's /OUTB terminal, and a single source coupled to the COMMON node;
a sixth transistor having a gate and a drain coupled to the second node, and a source coupled to the first power supply terminal;
a seventh transistor having a drain coupled to the PULLUPBIAS node, a gate coupled to the gate of the sixth transistor, and a source coupled to the first power supply terminal; and
an eighth transistor having a gate and a drain coupled to the PULLUPBIAS node, and a source coupled to the second power supply terminal.

4. The phase multiplier circuit of claim 3, wherein the COMMON node is coupled to the second power supply terminal.

5. The phase multiplier circuit of claim 3, further comprising a current source coupled between the COMMON node and the second power supply terminal.

6. The phase multiplier circuit of claim 4, wherein:
the sixth dual-gate transistor, and the first dual-gate transistor of the first, second, and third phase multiplier subcircuits have substantially the same physical dimensions;
the sixth transistor, and the first transistor of the first, second, and third phase multiplier subcircuits have substantially the same physical dimensions;
the seventh transistor, and the second transistor of the first, second, and third phase multiplier subcircuits have substantially the same physical dimensions; and
the eighth transistor, and the third transistor of the first, second, and third phase multiplier subcircuits have substantially the same physical dimensions.

7. The phase multiplier circuit of claim 6, wherein the first, second, and third phase multiplier subcircuits each further comprise:
a tenth transistor, providing additional loop filter capacitance, having a gate coupled to the BIASP node, and having a drain and a source coupled to the second power supply terminal; and
an eleventh transistor having a drain coupled to the BIASP node, a gate coupled to a RESET subcircuit terminal, and a source coupled to the first subcircuit power supply terminal.

8. The phase multiplier circuit of claim 7, wherein:
the RESET subcircuit terminals of the first, second, and third phase multiplier subcircuits are coupled to a RESET input terminal;
the phase multiplier circuit is at an initial state when the RESET terminal is at a logic high level; and
the phase multiplier circuit transitions from the initial state to a final state after the RESET terminal is de-asserted from a logic high level to a logic low level.

9. The phase multiplier circuit of claim 7, further comprising:
an input signal coupled to the input signal terminal;
a first power supply voltage applied to the first power supply terminal;
a second power supply voltage applied to the second power supply terminal; and
a reset signal, applied to the RESET terminal, which is asserted and then de-asserted.

10. The phase multiplier circuit of claim 9, wherein after transitioning to the final state:
the first output terminal exhibits a signal having a first phase;
the second output terminal exhibits a signal having a second phase;
the third output terminal exhibits a signal having a third phase;
the fourth output terminal exhibits a signal having a fourth phase; and
the first, second, third, and fourth phases are substantially evenly spaced between 0 and 360 degrees.

11. The phase multiplier circuit of claim 3, wherein:
the first inverter comprises:
a tenth transistor having a drain coupled to the first phase multiplier subcircuit's /INB subcircuit terminal, a gate coupled to the input signal terminal, and a source coupled to the first power supply terminal; and
an eleventh transistor having a drain coupled to the first phase multiplier subcircuit's /INB subcircuit terminal, a gate coupled to the input signal terminal, and a source coupled to the second power supply terminal; and
the second inverter comprises:
a twelfth transistor having a drain coupled to the first output terminal, a gate coupled to the first phase multiplier subcircuit's /INB subcircuit terminal, and a source coupled to the first power supply terminal; and a thirteenth transistor having a drain coupled to the first output terminal, a gate coupled to the first phase multiplier subcircuit's /INB subcircuit terminal, and a source coupled to the second power supply terminal.

12. A phase multiplier which generates output signals, each output signal having a phase relative to one of the output signals, said phase multiplier comprising:

means for generating substantially equal bias currents, the bias currents being proportional to a difference in phase between the output signal with the smallest phase and the output signal with the largest phase;

for each output signal except the output signal with the largest phase, means for generating a phase current proportional to a difference between the phase of the output signal and the phase of the output signal with the next-largest phase, and of a polarity opposite that of the bias currents;

for each output signal, means for generating a voltage by integrating the phase current and one of the bias currents onto a loop filter capacitance; and means for controlling the phases which includes voltage-controlled delay elements and the generated voltages.

13. The phase multiplier of claim 12, wherein the phases of the output signals are substantially evenly spaced between 0 and 360 degrees.

14. A phase multiplier which generates output signals, each output signal having a phase relative to one of the output signals, said phase multiplier a bias current generator which generates a plurality of substantially equal bias currents, said plurality of bias currents being proportional to a difference in phase between the output signal with the smallest phase and the output signal with the largest phase;

a phase current generator generating a phase current for each output signal except the output signal with the largest phase, said phase currents being proportional to a difference between the phase of the output signal and the phase of the output signal with the next-largest phase, and of a polarity opposite that of the bias currents;

a voltage generator which generates for each output signal a voltage by integrating the phase current and one of the bias currents onto a loop filter capacitance; and a phase controller for controlling the phases.

* * * * *